United States Patent [19]

Meyer et al.

[11] Patent Number: 4,929,596
[45] Date of Patent: May 29, 1990

[54] PROCESS FOR PRODUCING A MULTIPLE-FILAMENT OXIDE SUPERCONDUCTOR

[75] Inventors: Gundolf Meyer, Birmenstorf; Erwin Schönfeld, Baden-Dättwil; Clemens Verpoort, Fislisbach, all of Switzerland

[73] Assignee: Asea Brown Boveri AG, Baden, Switzerland

[21] Appl. No.: 220,251

[22] Filed: Jul. 18, 1988

[30] Foreign Application Priority Data

Jul. 24, 1987 [CH] Switzerland ............... 2818/87
Oct. 30, 1987 [CH] Switzerland ............... 4263/87
Jan. 14, 1988 [CH] Switzerland ............... 113/88

[51] Int. Cl.$^5$ ................... H01L 39/24; B22F 7/00
[52] U.S. Cl. ........................... 505/1; 427/62; 29/599; 505/740; 505/704; 419/19; 419/49; 419/8; 419/48
[58] Field of Search .............. 427/62, 63; 29/599; 505/1, 704, 740; 148/6.31; 419/19, 49, 8, 48

[56] References Cited

U.S. PATENT DOCUMENTS

| | | | |
|---|---|---|---|
| 3,922,769 | 12/1975 | Brenan | 419/48 |
| 4,755,493 | 7/1988 | Takeuchi et al. | 501/136 |
| 4,824,826 | 4/1989 | Damentor et al. | 505/1 |
| 4,826,808 | 5/1989 | Yurek et al. | 505/1 |

FOREIGN PATENT DOCUMENTS

0087691 9/1983 European Pat. Off. .

OTHER PUBLICATIONS

Jin et al., "High Tc Superconductors-Composite Wire Fabrication", Appl. Phys. Lett. 51(3), Jul. 1987, pp. 203-204.
Politis et al., "Superconductivity at 40K in La$_{1.8}$Sr$_{0.2}$CuO$_4$", Z. Phys. B—Condensed Matter 66, pp. 141-146, Jun. 1987.
Schirber et al., "Pressure Dependence of the Superconducting Transition Temperature in the 94-K Superconductor YBa$_2$Cu$_3$O$_7$", Phys. Rev. B 35(16) Jun. 1987, p. 8709.
Ohmatsu et al., "Superconducting Wires of High Tc Oxides", Jpn. J. Appl. Phys., vol. (26) Jul. 1987, Supplement 26-3, EK32.
Wills et al., "Hot Isostatic Pressing of Ceramic Materials", MRS, vol. 17, edited by Davis et al., 1984, pp. 559-570.
Japanese Journal of Applied Physics, vol. 26, No. 5, May 1987, pp. 1736-1737, "Preparation of High-Tc ... Superconductor", T. Kawai, et al.
Japanese Journal of Applied Physics, vol. 26, No. 5, May 1987, pp. 2865-2866, "Critical Current ... Superconductor", S. Nakayama, et al.
Toshiba Corporation, R & D Center, "Superconducting Wire and Coil with ... Density of 501A/cm$^2$ at 77K", H. Yoshino, et al.
Advanced Ceramic Materials—Ceramic Superconductors, vol. 2, No. 3B, Jul. 1987, Special Supplementary Issue (Westerville, Ohio) pp. 338-340, 471-479, 530-538.

Primary Examiner—Norman Morgenstern
Assistant Examiner—Roy V. King
Attorney, Agent, or Firm—Oblon, Spivak, McClelland, Maier & Neustadt

[57] ABSTRACT

Production of a sheathed wire or multiple-filament conductor composed of ceramic high-temperature superconductor by mixing Y$_2$O$_3$, CuO and BaO$_2$ or BaO$_2$+BaO, loading the powder mixture (3) into the interior of a metal sheath (1) lined with Ag intermediate layer (2), slowly heating to a maximum permissible reaction/sintering temperature of 950° C. in a period of at least 0.1 h, holding the sintering temperature for at least 1 h, cooling down to 200° C. at most 10° to 100° C./h to form a conducting core (4) composed of YBa$_2$Cu$_3$O$_{6.5-7.5}$. Variants having a layer composed of CuO, diffusion barrier composed of Ni, Ta, Nb, V or having Ag intermediate layer doped with AgO or BaO$_2$. Preferably reactive sintering under a pressure of 10 to 10.000 bar as hot isostatic pressing. Variant: reactive annealing of the powder mixture under oxygen pressure of 10 to 3000 bar at 600° to 950° C. Pulverizing of the body formed, loading into the metal sheath (1), fabrication, sintering to form a compact superconductor under an external pressure of 10 to 3000 bar at 500° to 900° C. Multiple-filament conductor with centrally arranged tracks of oxygen-releasing substances surrounded by peripheral superconductor tracks.

2 Claims, 6 Drawing Sheets

PROCESS FOR PRODUCING A MULTIPLE-FILAMENT OXIDE SUPERCONDUCTOR

BACKGROUND OF THE INVENTION

Field of the Invention

Technology of electrical superconductors.

Recently, the materials which have superconducting properties, have been acquiring increasing importance. The discovery of new superconducting materials, in particular of the rare earths/Ba/Cu/O type, led to an appreciable extension of the possible applications for superconductors since these substances become superconducting even at temperatures above 50K.

The invention relates to the further development and improvement of components composed of a ceramic high-temperature superconductor in wire form, it being intended to take the requirements of industrial large-scale production into consideration.

In particular, it relates to a process for producing a sheathed wire or a multiple-filament conductor composed of a ceramic high-temperature superconductor based on a ceramic substance of the $REBa_2Cu_3O_{6.5+y}$ type, where RE denotes a rare earth metal and $0<y<1$, and the said substance is arranged as a core in a copper sheath which serves as mechanical support and standby-current conductor by loading the pulverulent starting materials, which are mixed in an approximately stoichiometric ratio and are composed of rare earth metal oxide, barium-oxygen compound and copper oxide (CuO) or the finished superconductor powder, into a metal tube and subjecting the whole to a hot and/or cold-working process by compressing, rolling, rotary swaging and drawing for the purpose of fabrication, and finally, exposing it to a heat treatment.

Discussion of background

The production of superconductors of the $REBa_2Cu_3O_{6.5-7}$ type by preparing and mixing powders of the starting materials and subsequent heat treatment is known. As a rule, $Y_2O_3/CuO$ and BaO or $BaCO_3$ are used as starting materials. In the case of $BaCO_3$, the $CO_2$ has to be driven off by an additional calcination process (cf. T. Kawai and M. Kanai, "Preparation of high-Te Y-Ba-Cu-0 Superconductor", Jap. Jour. of Applied Physics, vol. 26, No. 5, May 1987, pp. 1736-1737; Y. Yamada, N. Fukuschima, S. Nakayama and S. Murase, "Critical current density of wire type Y-Ba-Cu-Oxide superconductor", Jap. Jour. of Applied Physics, vol. 26, No. 5, May 1987, pp. 2865-2866). In that case, sintering is carried out in an oxygen-containing atmosphere (air), that is to say, under a certain $O_2$ partial pressure. As a result the ambient sintering atmosphere makes its contribution to the achievement of a slightly superstoichiometric oxygen content of the compound It has also been proposed that the sintering process be carried out in a narrow silver tube. Silver is permeable to elementary oxygen so that the latter penetrates the core material by diffusion (cf. H. Yoshino, N. Fukushima, M. Niu, S. Nakayama, Y. Aamada and S. Murase, "Superconducting wire and coil with zero resistance state at 90K and current density of 510A/cm² at 77K", Toshiba Corporation, R & D Center, Saiwai-Ku, Kawasaki-City 210, Japan).

If an attempt is made to replace the narrow silver tube by a narrow copper tube, this results in a failure. At a sintering temperature of 700° C. and over, the copper reacts with the superconducting compound and extracts oxygen therefrom. As a result of this, the internal structure is altered in a manner such that it loses its superconducting properties. In addition, copper is not permeable to elementary oxygen so that the above process cannot be extrapolated to copper. An external application of high $O_2$ partial pressure would not have any success.

There is therefore a considerable need to find methods and propose processes which do not have the above inadequacies.

SUMMARY OF THE INVENTION

Accordingly, one object of this invention is to propose a process for producing a sheathed ceramic high-temperature superconductor based on a rare earth/barium/copper/oxygen compound in wire form which is simple and inexpensive in its execution and, for the superconducting core material ensures the provision of the oxygen excess necessary for superconduction during the production and operating period.

This object is achieved by the process mentioned in the introduction which comprises using a barium-oxygen compound composed of $BaO_2$ or a mixture of $BaO_2$ and BaO.

BRIEF DESCRIPTION OF THE DRAWING

A more complete appreciation of the invention and many of the attendant advantages thereof will be readily obtained as the same becomes better understood by reference to the following detailed description when considered in connection with the accompanying drawings, wherein.

Figure 1:
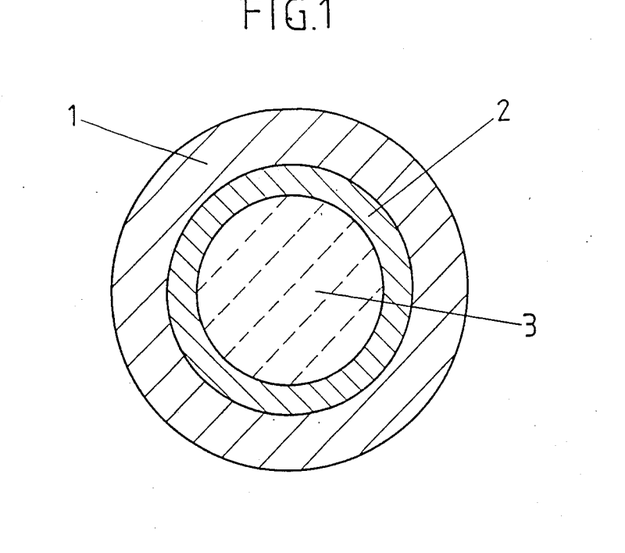
FIG. 1 shows a diagrammatic cross section through a wire before the heat treatment.

FIG. 1 shows a diagrammatic cross section through a wire in the finished form state, i.e. after the rolling, rotary swaging, drawing etc. but before the heat treatment. 1 is a metal sheath (copper tube) which serves as mechanical support for preserving the geometrical shape and as electrical standby-current conductor. 2 is an intermediate layer composed of silver in the form of a tube or galvanic or other coating. 3 is the mixture: $Y_2O_3/BaO/BaO_2/CuO$ which is composed of the starting materials in powder form (particle size approximately 1 to 50 μm). The mixing ratio is adjusted so that an oxygen excess is present compared with the stoichiometric compound. This takes account, in addition, of the oxygen losses to be anticipated during the production. As a result of this, the result is achieved that, despite the oxygen which unavoidably diffuses out of the core, sufficient supply of oxygen is present in the core to form an optimum superconductor compound.

Figure 2:
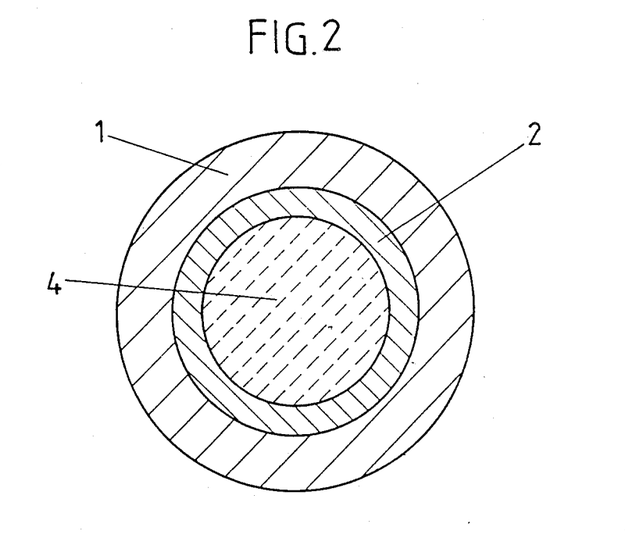
FIG. 2 shows a diagrammatic cross section through a superconducting wire after the heat treatment.

FIG. 2 shows a diagrammatic cross-section through a superconducting wire after the heat treatment (reaction of the starting materials, sintering of the core). 1 is the metal sheath, 2 is the intermediate silver layer. 4 is the core composed of superconducting ceramic, e.g. of $YBa_2Cu_3O_{6.5-7.5}$.

Figure 3:
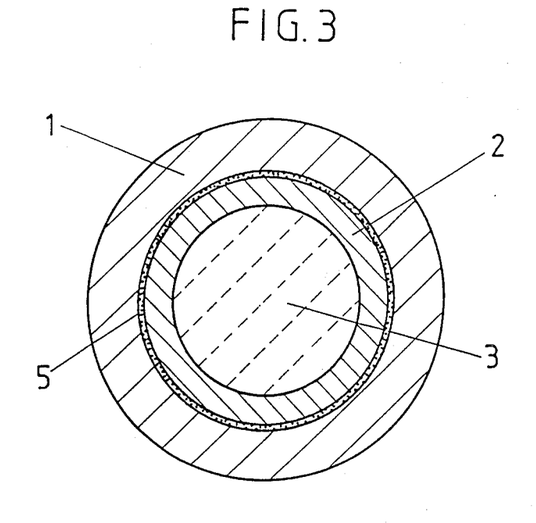
FIG. 3 shows a diagrammatic cross section through a wire having a CuO layer before the heat treatment.

FIG. 3 shows a diagrammatic section taken transversely through a wire having a CuO layer before the heat treatment. 1 is the metal sheath, in this case of copper, which is oxidized on its inside surface. The layer 5 composed of copper oxide (CuO) has a thickness of approximately 100 μm. Said layer 5 makes a further oxidation of the sheath 1 from the inside outwards and a depletion of the core material in oxygen more difficult. The CuO acts like a local increase in the oxygen partial pressure. 3 is the powder mixture composed of $Y_2O_3/BaO/BaO_2/CuO$ before the heat treatment.

Figure 4:
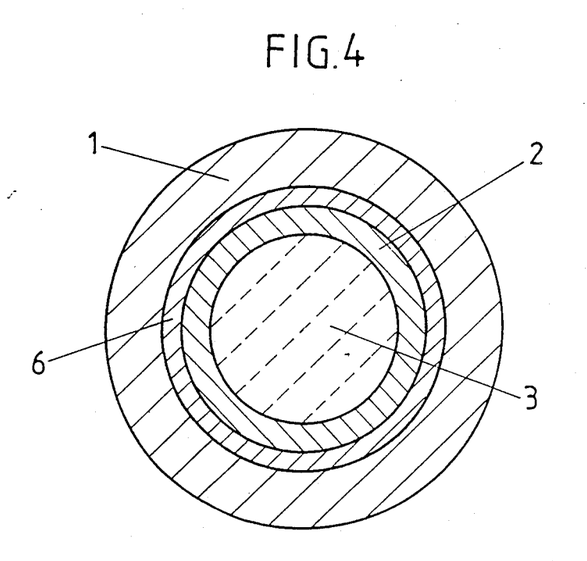
FIG. 4 shows a diagrammatic cross section through a wire having a diffusion barrier before the heat treatment.

FIG. 4 shows a diagrammatic section through a wire having a diffusion barrier before the heat treatment. The reference symbols 1, 2 and 3 and their meaning correspond precisely to those of FIG. 1. 6 is a diffusion barrier composed of tantalum, niobium, vanadium or nickel, which substantially suppresses the migration of oxygen out of the core material. Instead of being composed of one of the abovementioned substances, the diffusion barrier 6 may also be composed of an alloy of at least two of said elements.

Figure 5:
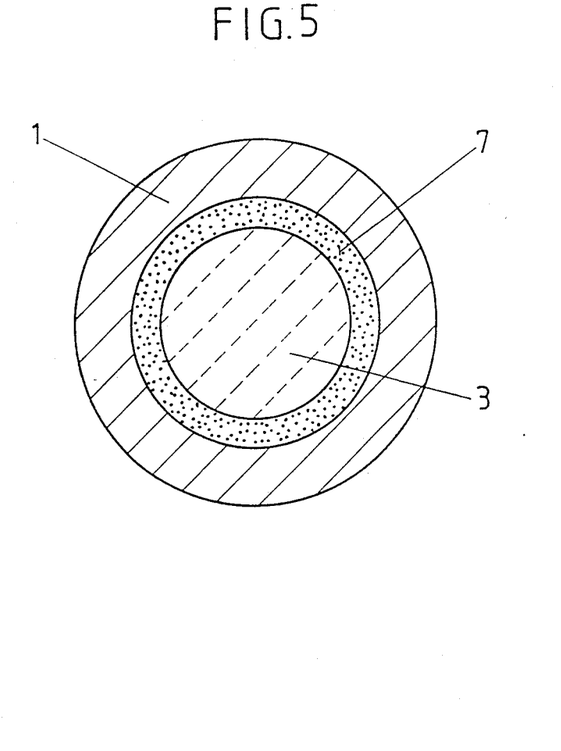
FIG. 5 shows a diagrammatic cross section through a wire having a layer containing a reservoir of oxygen before the heat treatment.

FIG. 5 shows a diagrammatic cross-section through a wire having a layer with a reservoir of oxygen before the heat treatment. 1 is the metal sheath, 3 the powder mixture composed of $Y_2O_3/BaO/BaO_2/CuO$ and 7 is an intermediate layer composed of silver which is doped with silver oxide (AgO) or with barium peroxide $BaO_2$. The function of this oxide is similar to that of the CuO in FIG. 3.

Figure 6:
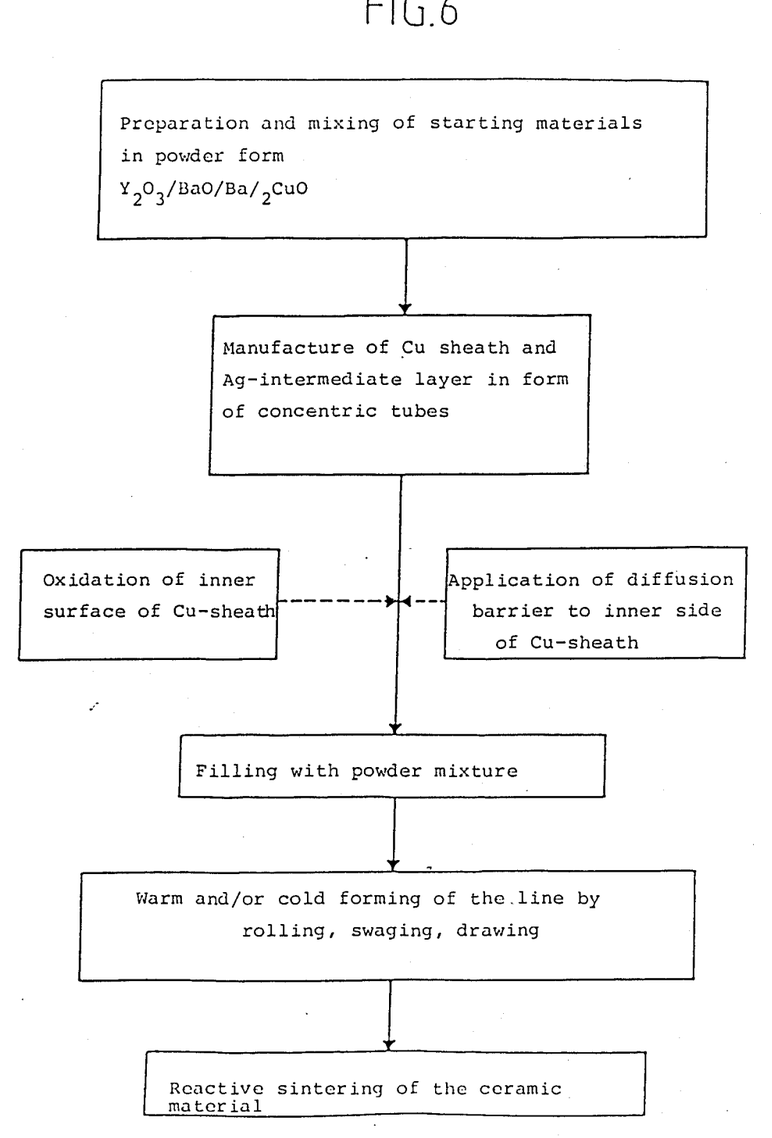
FIG. 6 shows a flow diagram of the process sequence according to variant I.

FIG. 6 relates to a flow diagram of the process sequence according to variant I. Said diagram is self-explanatory. As sub-variants to the essential process steps, "oxidation of the inside of Cu-sheath" or "provision of diffusion barrier on the inside of the Cu sheath" have been drawn in as alternatives (indicated by broken lines).

Figure 7:
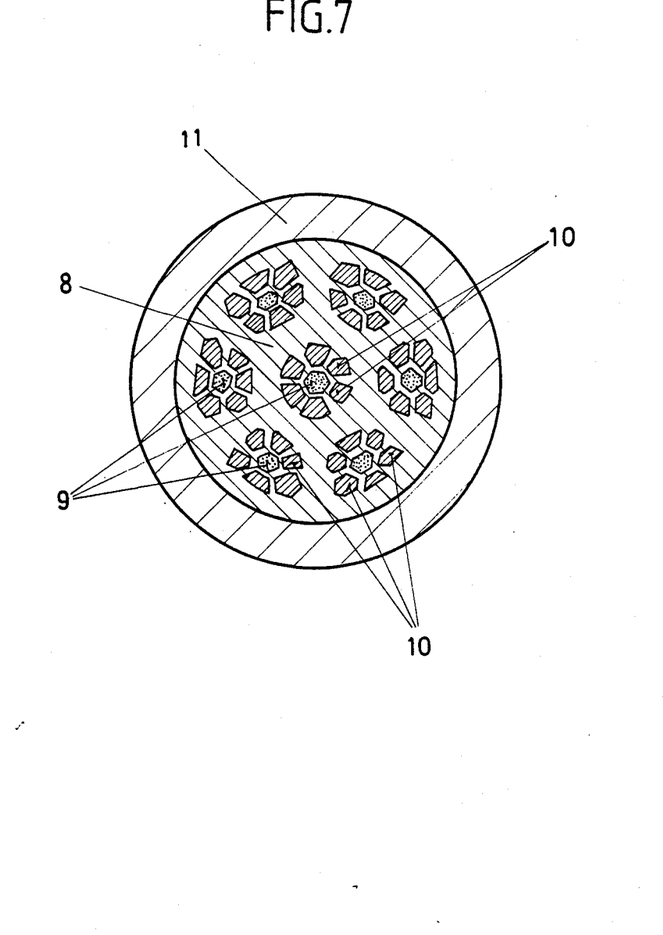
FIG. 7 shows a diagrammatic cross section through a multiple-filament conductor having a reservoir of oxygen.

FIG. 7 shows a diagrammatic cross-section through a multiple-filament conductor having a reservoir of oxygen. A multiplicity of filaments is embedded in a silver body 8 which is surrounded on all sides by a nickel cladding 11 as mechanical support and as corrosion protection and which serves as a framework and as a standby-current conductor. There are several groups of holes present, a central hole and a series of peripheral holes being present per group. 9 is a central hole filled with an oxygen-releasing substance (e.g. $BaO_2$). 10 is a peripheral hole filled with the finished superconductor powder (e.g. $YBa_2Cu_3O_7$). The holes, which are round in the original silver block, in general assume polygonal cross sections as a result of the reduction in cross section undergone during the working (fabrication).

Figure 8:
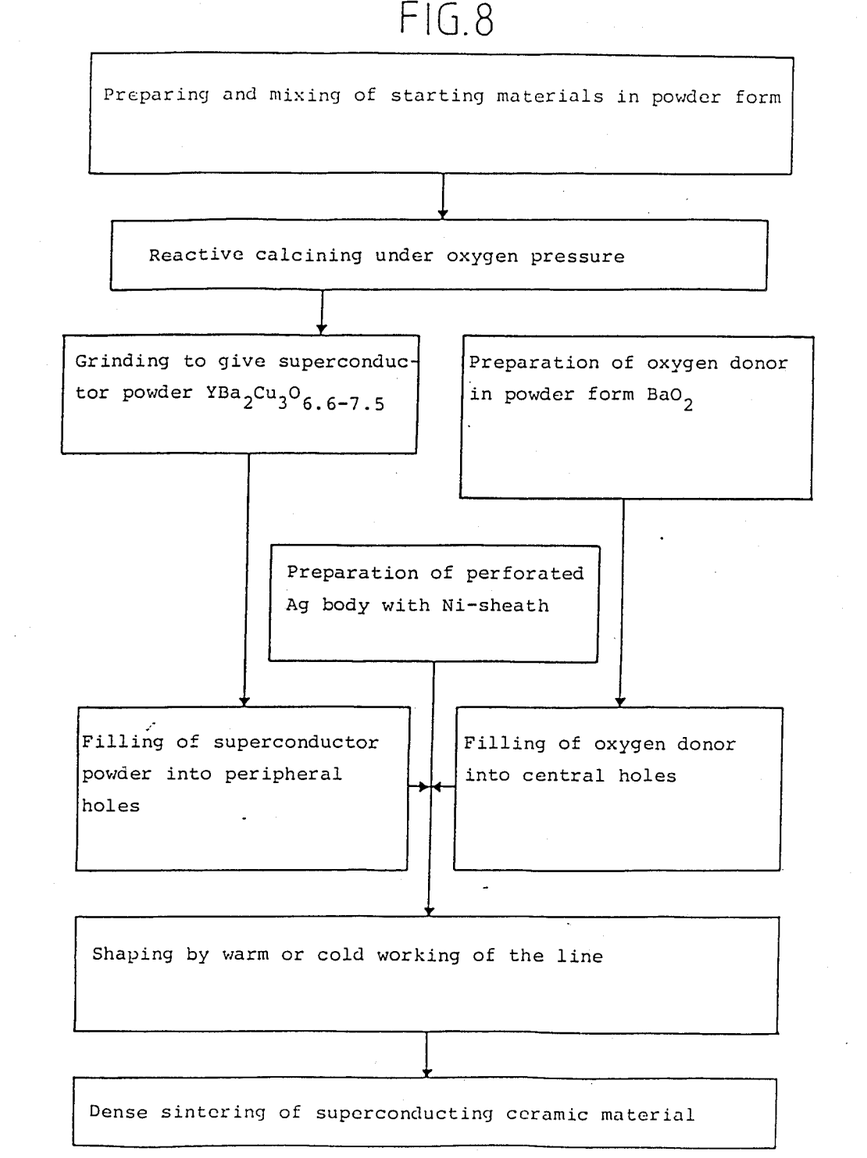
FIG. 8 shows a flow diagram of the process sequence according to variant II.

FIG. 8 relates to a flow diagram of the process sequence according to variant II. This variant is for application particularly in the production of multiple-filament conductors as shown in FIG. 7. The diagram is self explanatory.

Exemplary embodiment 1:
See FIGS. 1 and 2.

A copper tube with 15 mm outside diameter and 10 mm inside diameter (wall thickness 2.5 mm) was used as metal sheath 1. The silver intermediate layer 2 was formed by a silver tube with 10 mm outside diameter and 9 mm inside diameter (wall thickness 0.5 mm). The tolerances of the tubes were so dimensioned that the silver tube could be pushed into the copper tube so as to just sit tightly. Yttrium oxide ($Y_2O_3$), barium peroxide $BaO_2$ and copper oxide CuO were used as starting materials for the core. The mixing ratio of the substances followed the following pattern:

1 mol of $Y_2O_3$
4 mol of $BaO_2$
6 mol of CuO

Assuming a subsequent loss-free chemical reaction, this would correspond to a compound of the formula:

$$YBa_2Cu_3O_{8.5}$$

The starting substances were mixed and ground to a powder with a particle size of less than 10 μm in an agate mortar. Then the powder mixture 3 was loaded into the assembled tube and rammed solid. The ends of the tube were then sealed. Now the diameter of the tube was reduced by several cold working steps to a value of 10 mm. This fabrication was carried out by rotary swaging. The wire was then drawn down to a final diameter of 0.5 mm. The wire was now wound onto a coil former with a quartz-fiber fabric being interposed between these two windings. The whole was placed in an oven and heated slowly to the reaction and sintering temperature under an argon atmosphere and a pressure of 1 bar. The process of heating up to a temperature of 700° C. lasted 10 h. This temperature was then held for 50 h. Then the sintered body was cooled in the oven to approx. 200° C. at a rate of 50° C./h and then allowed to cool in air to room temperature. In view of the direct Cu/Ag contact, care should be taken to ensure that the sintering temperature does not reach the value of the low-melting eutectic (779° C.).

Exemplary embodiment 2:
See FIG. 3.

The copper tube with 14 mm outside diameter and 9 mm inside diameter which serves as metal sheath 1 was first oxidized on its inside in a stream of oxygen at 600° C. The copper oxide layer 5 was adjusted to a thickness of 50 μm. Then a silver tube with 9 mm outside diameter and 8 mm inside diameter (wall thickness 0.5 mm) was inserted. Now the starting material was poured in as in Example 1. The filled tube, sealed at its ends was first subjected to cold isostatic pressing for the purpose of compacting the powder mixture 3. Then the wire was drawn down to a diameter of 0.6 mm. After fabrication, the body was subjected to a heat treatment as described in Example 1, but under a pressure of 10 bar, and finally slowly cooled down.

Exemplary embodiment 3:
See FIG. 4.

Numerous holes with parallel axes and an axis spacing of 18 mm were drilled in a prismatic copper block as continuous common metal sheath 1. The holes had a diameter of 12 mm. Now tantalum tubes with an outside diameter of 12 mm and an inside diameter of 11 mm (wall thickness 0.5 mm) were pushed into these holes and into them were pushed further tubes of silver with an outside diameter of 11 mm and an inside diameter of 10 mm (wall thickness 0.5 mm). Then the holes in the copper block fitted with tubes were filled with a powder mixture 3 of the following mixing ratio:

1 mol of $Y_2O_3$
3 mol of BaO
1 mol of $BaO_2$
6 mol of CuO

This corresponds to a compound with the hypothetical composition $YBa_2Cu_3O_7$

The prismatic copper block was now reduced in its cross-section successively to about 1/10 of the original value using grooved rolls, the holes still having a diameter of approx. 3 mm. The bar produced in this manner was then reduced once again by drawing to about half of its previous diameter (remaining hole diameter approx. 1.5 mm.). The bar was then placed in a hot-isostatic pressing installation which was flooded with argon. The pressure was raised to a value of 200 bar and the bar was slowly brought to a temperature of 950° C. The duration of heating up was approx. 12 h. The temperature was then held at 950° C. and the pressure at 200 bar for 5 h. The cooling down of the multiple-filament conductor so formed was carried out at a rate of 20° C./h.

Exemplary embodiment 4:
See FIG. 5

A copper tube with 14 mm outside diameter and 10 mm inside diameter (wall thickness 2 mm) was used.

The intermediate silver layer 7 was composed of a tube of 10 mm outside diameter and 8.5 mm inside diameter (wall thickness 0.75 mm) which was doped with 10% by weight of $BaO_2$. The tube had previously been produced by powder-metallurgy methods (e.g. by mechanical alloying). The doped silver tube was fitted into the copper tube so as to sit tightly. The starting material for the core was a powder mixture composed of $Y_2O_3$, $BaO_2$ and CuO:

1 mol of $Y_2O_3$
2 mol of $BaO_2$
6 mol of CuO

This powder was presintered for 10 h at 900° C. and the sintered body was ground again. A further 2 mol of $BaO_2$ were added to this powder and the whole was poured as powder mixture 3 into the assembled tube and rammed solid. The further processing of the strand was carried out in exactly the same manner as specified in Example 2.

The intermediate layer 7 doped with $BaO_2$ can also be deposited on the inside of the metal sheath 1 by combined electrolytic/electrophoretic deposition from an electrolyte in which $BaO_2$ powder is suspended. Furthermore, the intermediate layer 7 can be produced by oxidizing the silver tube in a stream of oxygen at temperatures around approx. 100° C.

Exemplary embodiment 5:
Compare FIG. 7.

A total of 7 holes with parallel axes and 12 mm diameter were drilled in a cylindrical silver rod with 50 mm diameter as a continuous common metal sheath. Around a central hole, 6 further holes were arranged centrosymmetrically so that their axes formed an equilateral hexagon. The axis spacing was consequently the same for all the holes and was 15 mm. The silver bar was fitted tightly into a nickel tube with 50 mm inside diameter and 64 mm outside diameter (wall thickness 7 mm). The whole was then fitted axially into a copper tube as the outermost cladding. The copper tube had an inside diameter of 64 mm and an outside diameter of 80 mm.

The central hole 9 was now filled with the oxygen releasing substance in the form of $MnO_2$ powder. Powder Powder composed of a high-temperature superconductor was poured into the peripheral holes 10.

The superconductor material had the composition $YBa_2Cu_3O_{7+x}$, where $-0.5 < x < +0.1$ where x was approx. 0 in the present case. The production was carried out by mixing the ground components in the following mixing ratio:

1 mol of $Y_2O_3$
2 mol of BaO
2 mol of $BaO_2$
6 mol of CuO

This would correspond to a compound with the hypothetical composition:

$YBa_2Cu_3O_{7.5}$

The above powder mixture, which is superstoichiometric compared with the oxygen content of the target superconducting compound, was subjected to a reactive annealing process under oxygen atmosphere at a temperature of 950° C. and a pressure of 1000 bar for 10 h. As a result of the annealing process, the superconducting compound was formed in the form of a sintered body. The latter was first cooled slowly to approx. 500° C. and then rapidly to room temperature, with the pressure constantly being maintained. Then it was ground and the finished powder was loaded into the peripheral holes 10.

The silver bar, provided with a nickel sheath and a copper cladding and filled with the above powder, was now reduced in its cross-section successively to about 1/16 of the original dimension using grooved rolls, the holes still having a diameter of 3 mm. The cross-section of the workpiece was once again reduced to approx. 1/6 by drawing. The holes which originally had a diameter of 12 mm still had a dimension of approx. 1.2 mm. The workpiece was now brought to a temperature of 600° C. under an external pressure of 2000 bar and kept under these conditions for 10 h. Under these circumstances, the previously more or less loose powder particles of the superconducting compound sintered together in each case to form a compact continuous strand (filament). After this sintering process, the multiple-filament conductor produced in this manner was cooled down to room temperature.

Exemplary embodiment 6:
Compare FIG. 7

Groups each containing 7 holes with parallel axes and 6 mm diameter were drilled in a cylindrical silver block with 100 mm diameter as a continuous common metal sheath. 6 further holes were arranged centrosymmetrically each around a central hole so that their axes formed an equilateral hexagon. The axis spacing of the holes belonging to a group were 7.5 mm. The silver block was fitted tightly into a nickel tube with 100 mm inside diameter and 130 mm outside diameter, (wall thickness 15 mm).

The central holes 9 were filled with the oxygen-releasing substance in the form of a mixture of $BaO_2$ and BaO powder.

A powder mixture composed of the components of the superconducting material to be produced was poured into the peripheral holes 10. The powder was intended to have the composition $$YBa_2Cu_3O_{7+x}, \text{ where } -0.5 \leq x \leq 0.1$$

in the final state. The components were present in the following mixing ratio:
1 mol of $Y_2O_3$
3 mol of BaO
1 mol of $BaO_2$
6 mol of CuO This would correspond to the following stoichiometric compound:

$$YBa_2Cu_3O_7$$

The silver block, provided with a nickel sheath was now worked in several operations using grooved rolls and drawing in a manner similar to Example 5 so that the final diameter of the holes was still approx. 0.8 mm. The workpiece was now subjected to a reactive annealing and sintering process at a temperature of 900° C. and an external pressure of 2000 bar for 8 h. Under these conditions, the oxidic components reacted chemically and formed a superconducting compound. At the same time the powder particles sintered together and formed a continuous strand inside each tube formed by the silver body 8 (framework). After the annealing and sintering process, the workpiece was cooled down to 500° C. and held at this temperature and the pressure of 2000 bar for 10 h. Cooling was then carried out to room temperature. The oxygen excess present in the oxygen-releasing substance in the central holes 9 was able to diffuse through the silver body 8 into the superconducting material accommodated in the peripheral holes 10 and ensure the desired composition thereof. A sufficient reservoir of oxygen was consequently also available for the subsequent operation.

Exemplary embodiment 7:
Compare FIG. 7

A compound was first produced from the following components in powdered form:
1 mol of $Y_{2O3}$
4 mol of BaO
6 mol of CuO The powder mixture was subjected to a reactive annealing and sintering process at a temperature of 950° C. under an oxygen pressure of 1 bar for 10 h and subsequently quenched. The composition of the sintered body corresponded to the formula $$YBa_2Cu_3O_{7+x},$$

where x=approx. −0.6 in the present case. This compound is no superconductor per se since it lacks the necessary oxygen excess. It is a substance with semiconductor properties. The sintered body was ground and loaded into the peripheral holes 10 of a silver block as described in Example 6. As oxygen-releasing substance $Pb_3O_4$ in powder form was poured into the central holes 9. The silver block having a nickel cladding was worked as described in Example 6 by being considerably reduced in cross-section. The whole was now subjected to an annealing treatment at 800° C. under an external pressure of 1000 bar for 10 h. Cooling was now carried out slowly to 500° C. and this temperature was maintained under pressure for 40 h. Cooling was then carried out rapidly to room temperature. During this stepwise heat treatment, the complex compound absorbed the necessary oxygen and became the superconductor.

The invention is not limited to the exemplary embodiments. The final heat treatment after the hot and/or cold working process by pressing, rolling, rotary swaging and drawing are carried out in principle at temperatures up to 950° C.

Said heat treatment can be carried out in a different manner. It has to take account of the thermodynamic equilibrium of the reaction $BaO_2 \rightleftharpoons BaO + 1/2 O_2$ at 700° C. According to this the sintering temperatures (reaction temperatures) are 600° to 950° C. (preferably 700° to 950° C.) and the reaction times (holding times) 0.1 to 100 h (preferably 1 to 10 h), the pressures to be applied depending on the reaction temperatures and the construction of the wire (material and geometry of the sheathing etc.). An installation for hot isostatic pressing (pressure sintering) is therefore advantageously used to carry out the heat treatment. The pressures are accordingly 10 to 10,000 bar (preferably 50 to 2000 bar).

The barium-oxygen compound should be composed of $BaO_2$ or a mixture of $BaO_2$ and BaO. It should be pointed out that the use of $BaO_2$ instead of the hygroscopic BaO also offers advantages for the production of any desired superconductor bodies (other than wire material). Compared with the use of $BaCO_3$, there is the advantage of the omission of the calcination process (driving out of $CO_2$. The silver intermediate layer 2 to be arranged between core 4 and metal sheet 1 should have a thickness of 5 to 30% of the core diameter. This process step can be carried out by inserting a silver tube, spraying on silver or depositing it electrolytically on the inside of the copper tube. In the case of the direct Ag/Cu contact, sintering is carried out between 600° and 750° C. for 5–500 h (to avoid the incipient melting of the eutectic Ag/Cu). The same applies to the copper tube coated with CuO. The CuO layer should have a thickness of 1 to 100 μm. The diffusion barrier 6 is preferably composed of Ni, Ta, NB, V or a compound of at least two of these elements having a thickness of 2 to 20% of the core diameter. Sintering is carried out at 700° to 950° C. for 1 to 25 h. The silver intermediate layer 2 may be doped in a quantity of up to 90% by weight with an oxygen carrier in the form of an oxide which releases oxygen at fairly high temperature and which is selected from the compounds AgO and $BaO_2$.

The ratio of BaO to $BaO_2$ is adjusted so that, under the given sintering conditions, just enough oxygen diffuses (unavoidably) out of the core 4 through the surrounding silver intermediate layer 2 for the superconducting compound $YBa_2Cu_3O_{6.5+y}$ having an optimum y value between $0 < y < 1$ in relation to the superconducting properties to be finally left behind. The oxygen which has diffused out will essentially deposit, in the case of the exemplary embodiments 1, 2 and 4, as an oxide skin on the inside of the metal sheath 1 and in the case of exemplary embodiment 3 on the inside of the diffusion barrier 6 as an oxide of the elements Ni, Ta, NB and V.

According to a first variant, the process is carried out so that the pulverulent starting substances comprising rare earth metal oxide, barium-oxygen compound and copper oxide (CuO), which have not yet reacted with each other are used directly to produce the core 4 and are loaded into the metal tube. The latter is composed preferably of copper and surrounds the core 4 as an all-round sheath. Before the loading, a silver intermediate layer 2 is introduced between core 4 and sheath and this has a thickness of 5 to 30% of the core diameter. The heat treatment is carried out at a temperature of up to 950° C. for at least 0.1 h, the starting substances of the core 4 being reacted with each other to form a superconducting compound and being sintered. The heating up to sintering temperature is carried out in a period of at least 1 h, and the cooling down to 200° C. at a rate of 10 to 100° C./h.

According to a second variant, the process is carried out so that the pulverulent starting substances comprising rare earth metal oxide, barium-oxygen compound and copper oxide CuO are first subjected after mixing to a reactive annealing process under an oxygen pressure for 1 to 100 h. The sintered body formed in this process is ground to a particle size of at most 5 μm and the superconductor powder is loaded into the body forming the metal sheath 1. The composite body produced in this manner is now worked and sintered until compact under an external pressure of 10 to 3000 bar at a temperature of 500° to 900° C.

To produce a multiple-filament conductor, several groups of holes are arranged in a silver body 8 which is surrounded on all sides by a nickel cladding 11 and which serves as a framework. Each group has a central hole 9 which is filled with an oxygen-releasing substance. The latter is composed of $BaO_2$ or a mixture of $BaO_2$ and BaO or of $MnO_2$ or a mixture of $MnO_2$ and $Mn_2O_3$ or of $Pb_3O_4$ or a mixture of $Pb_3O_4$ and PbO. Around the central hole 9, are arranged further holes 10 into which a mixture of pulverulent starting substances (rare earth metal oxide, barium-oxygen compound, CuO) in an approximately stoichiometric ratio or finished superconductor powder previously produced by reactive annealing is poured. The whole is now reduced to a cross-section making up at most 2% using grooved rolls and drawing. Finally, annealing is carried out under a pressure of at least 10 bar at a temperature of 500° to 900° C. for at least 1 h during which the filaments formed from starting substances or superconductor powder are sintered together to form a monolithic compact superconductor body. Of course, the arrangement of the holes 9 and 10 and their function as spatial limitation for superconductor powder or oxygen-releasing substance may also be any other arrangement.

The main advantage of the invention is that not all the operations in the production of the superconductor have to be carried out under external oxygen pressure and that, at least in part, the use of substances (silver) which are permeable to oxygen as sheath materials with their long diffusion paths may be abandoned. The oxygen partial pressure, which is critical for the superconducting properties and characteristic of the superstoichiometry is primarily provided in situ by using oxygen-releasing substances.

What is claimed as new and desired to be secured by Letters Patent of the United States is:

1. A process for producing a multiple-filament oxide superconductor, wherein, at least one group of holes is arranged in a silver body provided with a nickel cladding which serves as a framework, in a manner such that around one central hole in each group there are arranged further holes, and wherein an oxygen-releasing substance whose oxygen saturation vapor pressure is between $10^{-3}$ bar and 2000 bar in a temperature range of 400° to 950° C. selected from the group consisting of $BaO_2$; a mixture of $BaO_2$ and BaO; $MnO_2$; a mixture of $MnO_2$ and $Mn_2O_3$; $Pb_3O_4$; and a mixture of $Pb_3O_4$ and PbO is poured into at least one of the central holes, and wherein a mixture of pulverulent starting substances consisting essentially of a rare earth metal oxide, a barium-oxygen compound selected from the group consisting of a $BaO_2$ and a mixture of $BaO_2$ and BaO and a copper oxide (CuO) in an approximately stoichiometric ratio to provide a desired superconductor or a preformed superconductor powder produced from the same starting substances is poured into the other holes, and wherein, the cross-section of the entire structure is successively reduced by at most 2% using grooved rolls and drawing and a multiple-filament oxide superconductor is formed by annealing the entire structure under a pressure of at least 10 bar at a temperature of 500° to 900° C. for at least 1 hr.

2. The process as claimed in claim 1 wherein the rare earth metal is Y.

* * * * *